United States Patent
Laforce

(10) Patent No.: US 9,246,023 B2
(45) Date of Patent: Jan. 26, 2016

(54) OPTICAL RECEIVER WITH FAST RECOVERY TIME

(71) Applicant: Excelitas Canada Inc., Vaudreuil-Dorion (CA)

(72) Inventor: Frederic Laforce, Coteau-du-Lac (CA)

(73) Assignee: Excelitas Canada, Inc., Vaudreuill-Dorion (CA)

( * ) Notice: Subject to any disclaimer, the term of this patent is extended or adjusted under 35 U.S.C. 154(b) by 319 days.

(21) Appl. No.: 13/850,624

(22) Filed: Mar. 26, 2013

(65) Prior Publication Data

US 2014/0291488 A1    Oct. 2, 2014

(51) Int. Cl.
*H01L 31/02* (2006.01)

(52) U.S. Cl.
CPC .................................. *H01L 31/02019* (2013.01)

(58) Field of Classification Search
CPC ................ H01L 31/02019; H01L 31/020196; H01L 31/02; H03G 3/3081; H03F 3/087; H03F 3/082; H03F 3/08; H04B 10/66; H04B 10/69; H04B 10/691; H04B 10/6911; H04B 10/60

See application file for complete search history.

(56) References Cited

U.S. PATENT DOCUMENTS

| | | | |
|---|---|---|---|
| 4,623,786 A | 11/1986 | Rodwell | |
| 5,168,154 A | 12/1992 | Harley | |
| 5,696,657 A | 12/1997 | Nourrcier et al. | |
| 5,708,392 A | 1/1998 | Gross | |
| 6,028,482 A | 2/2000 | Herrle | |
| 6,084,478 A | 7/2000 | Mayampurath | |
| 6,504,429 B2 | 1/2003 | Kobayashi | |
| 6,803,825 B2 | 10/2004 | Chiou et al. | |
| 6,874,750 B2 | 4/2005 | Muraji | |
| 7,561,812 B2 | 7/2009 | Tai et al. | |
| 2003/0219260 A1* | 11/2003 | Chiou et al. | 398/202 |
| 2004/0130397 A1 | 7/2004 | Mactaggart | |
| 2005/0128006 A1* | 6/2005 | Davies | 330/308 |
| 2005/0168289 A1* | 8/2005 | Schrodinger | 330/308 |
| 2005/0224697 A1* | 10/2005 | Nishiyama | 250/214 A |
| 2005/0286910 A1* | 12/2005 | Wernlund et al. | 398/202 |
| 2007/0109056 A1* | 5/2007 | Kwa et al. | 330/308 |
| 2009/0236502 A1* | 9/2009 | Ishii | 250/214 R |
| 2009/0238582 A1* | 9/2009 | Tsunoda et al. | 398/208 |

(Continued)

FOREIGN PATENT DOCUMENTS

EP    0643496 A1    3/1995

*Primary Examiner* — John Lee
(74) *Attorney, Agent, or Firm* — Peter A. Nieves; Sheehan Phinney Bass + Green PA

(57) ABSTRACT

A photoelectric receiver circuit for converting an optical signal to an electrical signal is presented. The receiver includes a photodetector connected between a transimpedance amplifier input and a high voltage supply providing a bias voltage to the photodetector. A high voltage supply variation sensing element is connected between the high voltage supply and a current controlled current source, where the current controlled source output is connected to the input of the transimpedance amplifier. A current limiter is connected between the high voltage supply and a high voltage source. The photocurrent passing through the current limiter lowers the high voltage supply and is detected by the sensing element. Current from the sensing element is processed at the input of the transimpedance amplifier to minimize the current into the transimpedance amplifier, limiting the saturation of the amplifier, thus improving recovery time when a high optical power pulse impinges the photodetector.

26 Claims, 3 Drawing Sheets

(56) References Cited

U.S. PATENT DOCUMENTS

2009/0243729 A1* 10/2009 Gao et al. .................. 330/296
2010/0252720 A1* 10/2010 Lan et al. ................. 250/214 A
2014/0124656 A1* 5/2014 Lan et al. ................. 250/208.2
2014/0263946 A1* 9/2014 Nguyen et al. ............. 250/206
2014/0291487 A1* 10/2014 Laforce ................... 250/214 LA
2014/0291488 A1* 10/2014 Laforce ................... 250/214 LA
2014/0361151 A1* 12/2014 Nomura .................... 250/214 R

* cited by examiner

OPTICAL RECEIVER WITH FAST RECOVERY TIME

FIELD OF THE INVENTION

The present invention relates to light sensors, and more particularly, is related to a photodetector circuit.

BACKGROUND OF THE INVENTION

Photodetectors are used to detect light of a given wavelength and produce a current proportional to the intensity of the detected light. A photodetector may be supplied with a bias voltage. The output of the photodetector may vary with variations of the bias voltage.

A prior art photodetector circuit 100 is shown in FIG. 1. The circuit includes a photodetector 150 between a high voltage supply 110 and a transimpedance amplifier (TIA) 180 including an amplifier 140 and a resistor 130. The signal (photocurrent) from the photodetector 150 is amplified by the transimpedance amplifier 180, thereby converting a photocurrent from the detector into an output voltage 160 suitable for post processing, for example, by a post processing circuit (not shown).

In the prior art photodetector circuit 100, the transimpedance amplifier 180 may be used to convert the photocurrent from the photodetector 150 into a voltage for further processing. Such circuits are widely used in various applications such as optical communication or laser range finding. In some applications, for example, communication applications, the average photocurrent is fairly constant and can easily be handled by the prior art transimpedance amplifier 180.

However, range finding applications behave differently in that the light signal level can be very low, for example, almost zero, followed by a strong optical pulse having a high, short duration signal level. When such a high power pulse impinges the detector 150, a large photocurrent can flow through the photodetector 150. This photocurrent may only saturate the optical receiver of the circuit 100, but may also damage both the photodetector 150 and transimpedance amplifier 180. Protection of the transimpedance amplifier 180 and photodetector 150 is thus very important.

It can take a while for the transimpedance amplifier 180 to return to pre-pulse condition after it has saturated. In normal operation the input impedance of the transimpedance amplifier 180 is approximately equivalent to the feedback resistance 130 divided by the voltage gain, Av, of the amplifier 140.

When the amplifier 140 saturates, the input impedance of the transimpedance amplifier 180 becomes approximately equal to the feedback resistance 130 in parallel with all parasitic capacitance including junction capacitance of the photodetector 150. The time required for the transimpedance amplifier 180 to recover is related to the resistance/capacitance (RC) time constant of the parasitic capacitance and feedback resistance 130 as well has the input voltage reached during saturation. The higher the photocurrent above saturation, the longer it takes to recover. This is referred to as the "depth of saturation" of the transimpedance amplifier 180.

Several strategies have been attempted to improve recovery time by reducing the equivalent input impedance during saturation. Such strategies include use of variable feedback impedance, variable shunt input impedance or input current sinking.

Variable feedback typically adds capacitance in the feedback path impacting the frequency response and noise of the optical receiver. Input current sinking is typically used to cancel low frequency input current. Most such strategies use some kind of feedback from the output of the transimpedance amplifier to react to the high photocurrent. This forces the user to reduce the bandwidth (frequency response) of the feedback in order to maintain the high frequency behavior of the receiver. However, in the case of high optical power pulse, it is not possible to use the output of the transimpedance amplifier 180 to apply protection since damage to the transimpedance amplifier 180 is likely to occur before the output can begin to respond to the signal. It is preferable to not rely on the output of the transimpedance amplifier 180 to improve recovery time.

Variable shunt impedance at input may include a diode for example reversed bias in normal operation and forward bias during saturation providing a low impedance. Recovery time is improved by limiting the input voltage reached during saturation but is dependent on the photocurrent from the photodetector.

Another technique to reduce the impact of a high power optical pulse is the use of a resistance in series with an avalanche photodiode (APD). This technique is useful for low frequency signals but not for high frequency signals or for signals in the presence of a strong optical power pulse since the series resistance impacts the bandwidth of the receiver, and if a decoupling capacitor is used to maintain the voltage after the resistance, the photocurrent from the photodetector is maintained as long as the decoupling capacitor can provide charges to the photodetector 150. Therefore, there is a need in the industry to address the above shortcomings.

SUMMARY OF THE INVENTION

Embodiments of the present invention provide an optical receiver with fast recovery time. Briefly described, a first aspect of the present invention is directed to a photoelectric receiver circuit for converting an optical signal to an electrical signal. The circuit contains a transimpedance amplifier, a photodetector connected between an input of the transimpedance amplifier and a high voltage supply providing a bias voltage to the photodetector. The circuit contains a high voltage supply variation sensing element connected between the high voltage supply and a current mirror having its output terminal connected the input of the transimpedance amplifier, and a current limiter connected between a high voltage source and the high voltage supply.

Briefly described, a second aspect of the present invention is directed to a photoelectric receiver circuit for converting an optical signal to an electrical signal. The circuit includes a transimpedance amplifier, a photodetector connected between an input of the transimpedance amplifier and a high voltage supply providing a bias voltage to the photodetector. The circuit includes a high voltage supply variation sensing element connected between the high voltage supply and current controlled current source (CCCS), and a current limiter connected between a high voltage source and the high voltage supply. The CCCS is connected to the input of the transimpedance amplifier.

Briefly described, in architecture, a third aspect of the present invention is directed to a photoelectric receiver circuit for converting an optical signal to an electrical signal, comprising a differential transimpedance amplifier, a photodetector connected between a first input of the differential transimpedance amplifier and a high voltage supply providing a bias voltage to the photodetector.

The circuit includes a first high voltage supply variation sensing element connected between the high voltage supply and a second input of the differential transimpedance amplifier, a second high voltage supply variation sensing element connected between the high voltage supply and a first CCCS. A current limiter is connected between a high voltage source and the high voltage supply. The first current controlled current source is connected between a second high voltage supply variation sensing element and the first input of the differential transimpedance amplifier. A second CCCS is connected between the second high voltage supply variation sensing element and the second input of the differential transimpedance amplifier.

Other systems, methods and features of the present invention will be or become apparent to one having ordinary skill in the art upon examining the following drawings and detailed description. It is intended that all such additional systems, methods, and features be included in this description, be within the scope of the present invention and protected by the accompanying claims.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principals of the invention.

DETAILED DESCRIPTION

Figure 1:
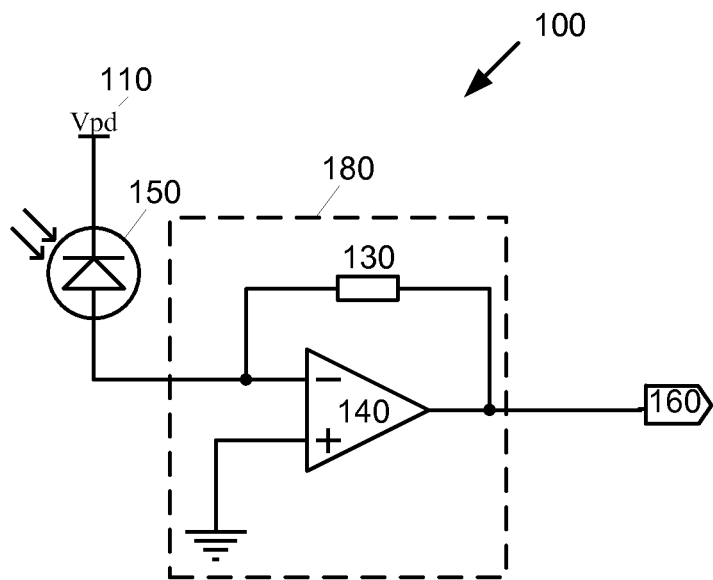
FIG. 1 is a circuit diagram of a prior art photodetector circuit.

Reference will now be made in detail to embodiments of the present invention, examples of which are illustrated in the accompanying drawings. Wherever possible, the same reference numbers are used in the drawings and the description to refer to the same or like parts.

Figure 2:
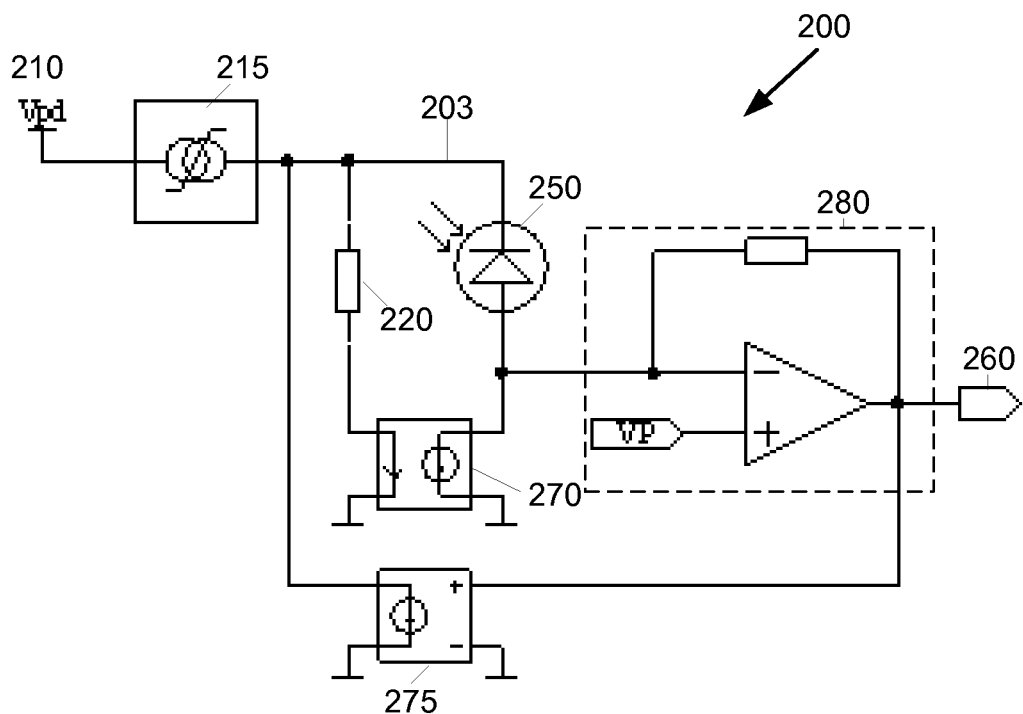
FIG. 2 is a circuit diagram of a first exemplary embodiment of a photodiode receiver.

A first exemplary embodiment of a photoelectric receiver in accordance with the current invention is shown in FIG. 2. The photoelectric receiver circuit 200 converts an optical signal to an electrical signal. The circuit 200 includes a transimpedance amplifier 280 with an output 260, a photodetector 250, for example, an avalanche photodiode, having its anode connected to the input of the transimpedance amplifier 280 and cathode connected to a high voltage supply 203 suitable for biasing the photodetector 250 to a required voltage, a high voltage supply variation sensing element 220 having its first terminal connected to the high voltage supply 203 and its second terminal connected to a current mirror 270, and a current limiter 215 connected between a high voltage source 210 and the high voltage supply 203. The current mirror 270 has its output terminal connected to the input of the transimpedance amplifier 280.

This circuit improves recovery time by strictly reducing the high voltage supply 203. The high voltage supply variation sensing element 220 substantially replicates the impedance of the photodetector 250. Elements 220 and 270 together with the photodetector 250 and transimpedance amplifier 280 form a pseudo-differential circuit not sensitive to variation of the high voltage supply 203. The high voltage supply 203 voltage is reduced when the photocurrent flows through the current limiter 215 which can reduce the gain of photodetector 250, assuming the gain is controlled by the high voltage supply 203. Reducing the gain of the photodetector 250 reduces the photocurrent and limits saturation depth, thus improving recovery time. The current limiter 215 may take the form of a simple load (a resistor for instance) or a variable load in response to the current flowing through it.

A feedback path 275 may be applied to the high voltage supply in response to the output of the transimpedance amplifier 280. As shown by FIG. 2, the feedback path 275 includes a current source 275 responsive to the output of the transimpedance amplifier 260. This feedback path 275 can further reduce the high voltage supply 203 voltage, thus improving the recovery time even further. Alternative embodiments may omit the feedback path 275.

Figure 3:
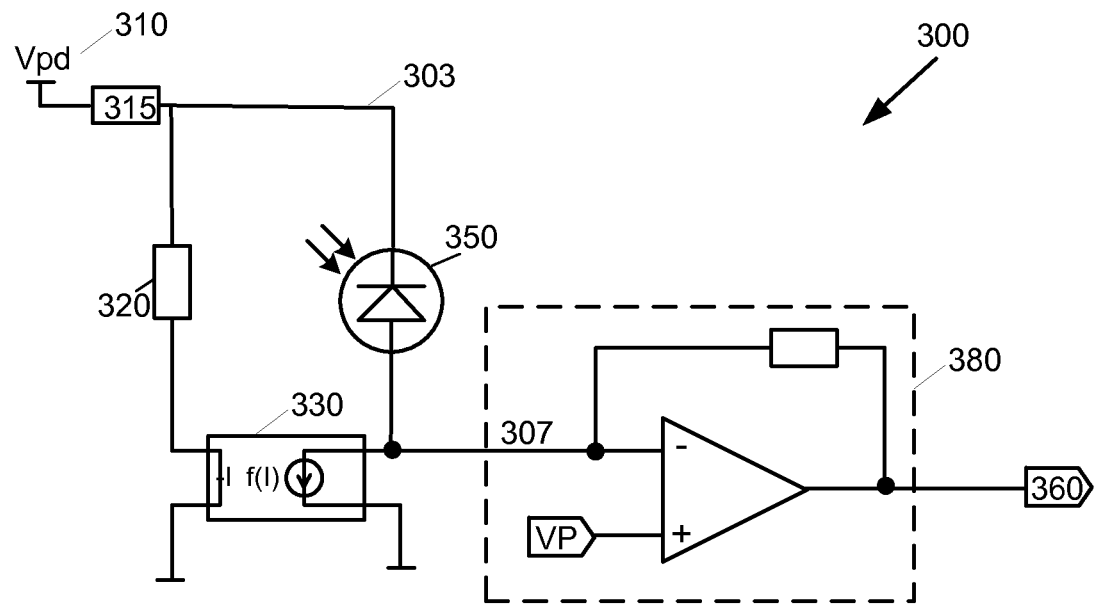
FIG. 3 is a circuit diagram of a second exemplary embodiment of a photodiode receiver.

A second exemplary embodiment of a photoelectric receiver circuit according the present invention is shown by FIG. 3. The photoelectric receiver circuit 300 converts an optical signal to an electrical signal. The circuit 300 includes a transimpedance amplifier 380 with an output 360, a photodetector 350, for example, an avalanche photodiode, having its anode connected to an input 307 of the transimpedance amplifier 380 and its cathode connected to a high voltage supply 303 suitable for biasing the photodetector 350 to a required voltage, a high voltage supply variation sensing element 320 having its first terminal connected to the high voltage supply 303 and its second terminal connected to a CCCS 330 and a current limiter 315 connected between a high voltage source 310 and the high voltage supply 303, the CCCS 330 having its output terminal connected to the input 307 of the transimpedance amplifier 380.

The high voltage supply sensing device 320 is used to convert any variation of the high voltage supply 303 voltage into a current which is sensed, rectified and mirrored through the CCCS 330 at the input 307 of the transimpedance amplifier 380. The high voltage supply sensing device 320 provides a current substantially equal to the current induced in the photodetector 350 in response to variation of the high voltage supply 303 through its equivalent impedance. The receiver 300 does not respond to a positive high voltage supply 303 variation but will "amplify" the impact of a negative voltage supply variation in the case of a full wave rectification by the CCCS 330 or will behave like a regular transimpedance amplifier in the case of a half wave rectification by the CCCS 330. This behavior is due to a negative voltage supply variation associated with a high photocurrent and a positive voltage supply variation associated with the high voltage supply 303 returning to its pre-saturation level which may be undesirable at the output 360.

The high voltage supply sensing device 320 preferably has an impedance of substantially equal value to the impedance of the photodetector 350. A current limiter 315 is located between the voltage source 310 and the high voltage supply 303. The current limiter 315 passes current freely up to a current threshold level where the current reaches a predefined limit. Thereafter, the current is clamped at the predefined limit until the input current falls below the current threshold level.

Under normal operation, the voltage of the high voltage supply 303 applied to the photodetector 350 is constant, and the photocurrent from the photodetector 350 is below the current threshold of the current limiter 315. In these circumstances, the circuit 300 behaves as a standard optical receiver, for example, an optical receiver built around a transimpedance amplifier and an avalanche photodiode, as per FIG. 1.

When the photocurrent is above the current threshold of the current limiter 315, the impedance of the current limiter 315 increases and the high voltage supply 303 voltage decreases following the current-voltage curve of the photodetector 350 for the optical power impinging on it. For example, in an embodiment where the photodetector 350 is an avalanche photodiode, since the gain of an avalanche photodiode 350 is proportional to the high voltage supply 303, the gain of the avalanche photodiode 350 decreases. This behavior limits the amplitude of the photocurrent thus protecting the transimpedance amplifier 380 and limiting the depth of saturation.

When the voltage level of the high voltage supply 303 decreases, current flows through the high voltage supply variation sensing device 320 towards the high voltage supply 303. The current in the high voltage supply variation sensing device 320 is sensed by the CCCS 330, is rectified, is possibly amplified, and is injected at the input 307 of the transimpedance amplifier 380.

The resulting current reaching the transimpedance amplifier 380 depends on the type of rectification. With no rectification, the current reaching the transimpedance amplifier 380 is only from the photocurrent. The current induced in the photodetector 350 due to high voltage supply 303 variation and in the voltage sensing device 320 is of substantially equal amplitude, thus canceling each other. Therefore, the receiver 300 is not sensitive to the high voltage supply variation. This indicates that the bandwidth of the receiver 300 is not affected by the high impedance of the current limiter 315 as would be the case without the high voltage sensing device 320 current being mirrored into the input of the transimpedance amplifier 380.

A drawback of this configuration is that the current going into the transimpedance amplifier 380, which would be reduced by a reduction of the high voltage supply 303 voltage, is no longer attenuated since the current from the high voltage supply variation sensing device 320 pushes current into the transimpedance amplifier 380, summing with the photocurrent. This may drive the transimpedance amplifier 380 into deeper saturation in case of high optical power.

Half rectification in the CCCS 330 may be used to allow the current mirrored into the input of the transimpedance amplifier 380 only when the high voltage supply 303 voltage increases, and no current is mirrored when the high voltage supply 303 voltage decreases. When the photocurrent is above the current threshold of the current limiter 315, the current in the photodetector 350 induced by a drop of the high voltage supply 303 voltage reduces the total current flowing through the transimpedance amplifier 380 which limits the depth of saturation of the transimpedance amplifier 380.

Full rectification in the CCCS 330 may be used to sink current from the input 307 of the transimpedance amplifier 380 when the high voltage supply 303 voltage decreases to further reduce the depth of saturation of the transimpedance amplifier 380. Amplification by the CCCS 330 of the current flowing in this direction is also possible to further reduce the depth of saturation.

When the optical power returns to zero or near zero after an overload condition, the high voltage supply 303 voltage starts increasing due to the current allowed to flow by the current limiter 315. The rate of change of the high voltage supply 303 voltage is fixed by the current limiter 315. The increase of the high voltage supply 303 voltage variation induces a current flowing through the equivalent impedance of the photodetector 350 and is amplified by the transimpedance amplifier 380. Note that this current flows in the same direction as the photocurrent. However, with the high voltage sensing element 320 current being mirrored at the input of the transimpedance amplifier 380, the transimpedance amplifier 380 does not respond to the recharge of the high voltage supply 303 as would be the case in prior art receivers. The result is that this circuit 300 allows recharging the high voltage supply 303 while the output of the transimpedance amplifier 380 does not respond to this recharge.

Note also that during the recharge of the high voltage supply 303, the bandwidth of the receiver 300 can be maintained even if the current limiter 315 is in a high impedance state. Therefore the optical receiver 300 is fully operational during the recharge of the high voltage supply 303. The current limiter 315 can be controlled, for example using logic circuitry or software (not shown), to increase or decrease the limit according to the system input.

In the event of a high power optical pulse impinging the photodetector 350, saturation of the transimpedance amplifier 380 may occur since the photocurrent goes directly to the transimpedance amplifier 380. To improve the recovery time of the receiver 300, the transimpedance amplifier 380 may be designed according to designs familiar to persons having ordinary skill in the art to increase dynamic range and/or improve recovery time after overload by using variable feedback resistance (not shown), or variable input impedance applied at the input 307 of the transimpedance amplifier 380.

While the second embodiment relies on the photocurrent to reduce the high voltage supply through the current limiter 315, under the first embodiment the high voltage supply 203 (FIG. 2) voltage reduction may be enhanced by a device in the feedback path 275 (FIG. 2) sinking current from the high voltage supply 203 (FIG. 2) in response to a light signal.

Figure 4:
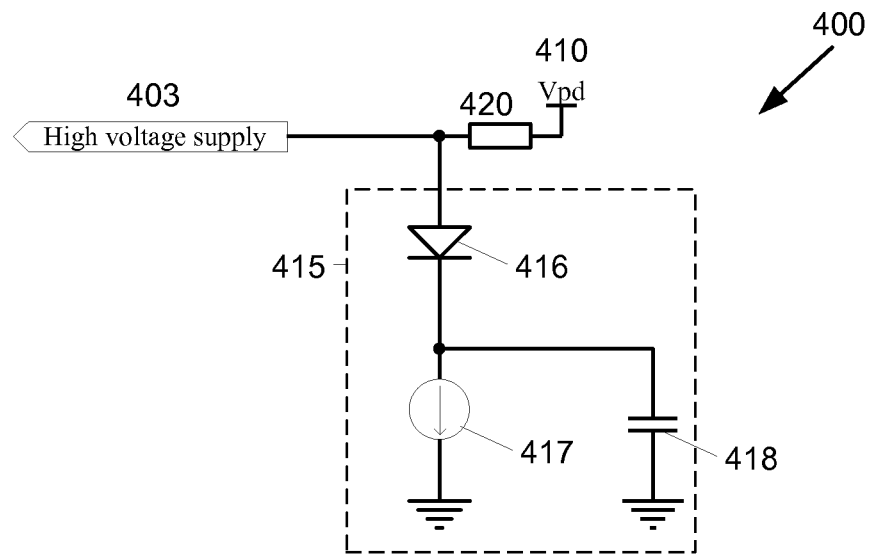
FIG. 4 is a circuit diagram detailing a current limiter of a third exemplary embodiment of a photodiode receiver.

One example of an instantiation of current limiter 315 (FIG. 3) of the second embodiment is shown by the circuit 400 of FIG. 4. The circuit 400 has low impedance when no photocurrent is present to minimize its impact on optical receiver bandwidth under low power operation. In a third embodiment, a current limiter 415 is designed around a PIN diode 416 or Schottky diode.

A small diode bias current is used to lower the impedance seen looking to the current limiter 415. The bias current is applied with a current source 417 in FIG. 400 and the cathode of the diode 416 is maintained to a low impedance node by the use of a decoupling capacitor 418. A resistor 420 of high value is located between high voltage source 410 and the high voltage supply 403. In normal operation the circuit 400 provides low impedance through the forward bias diode 416. When the current from the high voltage supply 403 is above the bias current of the diode 416, the diode 416 turns off and the impedance seen by the high voltage supply 403 increases and is defined by the resistor 420 between the high voltage source 410 and the high voltage supply 403. When the current is high, the high voltage supply 403 voltage decreases, indicating an overload condition.

Use of a PIN diode 416 instead of a Schottky diode has the advantage of providing a low series resistance and can handle high voltage variation but does not turn on and off quickly and has typically fairly high capacitance. In contrast, a Schottky diode 416 is fast to turn on and off but suffers from high series resistance and has small voltage tolerance. The high voltage supply 403 value returns to pre-overload condition through the resistance 420. While the circuit 400 of the third embodiment uses positive voltage supply 403, alternative embodiments may include a negative voltage supply.

Differential Embodiment

Figure 5:
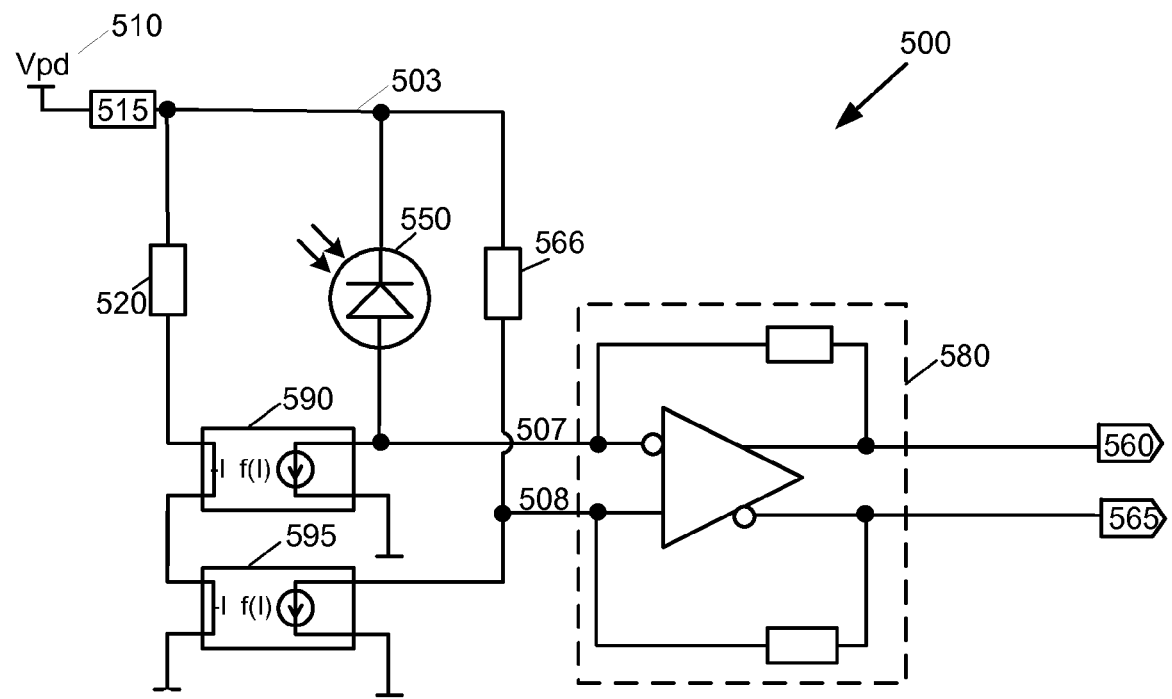
FIG. 5 is a circuit diagram of a fourth exemplary embodiment of a photodiode receiver with a differential transimpedance amplifier.

A fourth exemplary embodiment of a photoelectric receiver in accordance with the current invention is shown in FIG. 5.

The optical receiver 500 of the fourth embodiment uses a fully differential scheme where a differential transimpedance amplifier 580 is used. The differential transimpedance amplifier 580 has a first output 560 and a second output 565. A photodetector 550, for example, an avalanche photodiode, is connected to a first input 507 of a differential transimpedance amplifier 580 and a first high voltage sensing element 566 is connected to a second input 508 of the differential transimpedance amplifier 580. A first high voltage sensing element 566 has an impedance substantially equal to the impedance of the avalanche photodiode 550. Under this configuration, the current limiter may be implemented by a high value impedance 515, such as a resistor, and the frequency response of the optical receiver 500 is maintained by use of the differential transimpedance amplifier 580. The high value impedance 515 is connected between the high voltage source 510 and the high voltage supply 503 and may be viewed as a current limiter in the wide sense as described previously.

A second high voltage sensing element 520 is used to sense a voltage variation of the high voltage supply 503, as described previously regarding the first and second embodiments. The signal is preferably fully rectified by a first CCCS 590 and a current is sinked out of the first input 507 of the transimpedance amplifier 580. The signal is also preferably, but not necessarily, full wave rectified by a second CCCS 595 and is sinked out of the second input 508 of the transimpedance amplifier 580.

Circuits shown in FIG. 3 and FIG. 5 have an additional benefit where they can only sink a current from the input of the TIA reducing the total current entering the TIA when saturation occurs, and reducing saturation depth.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A photoelectric receiver circuit for converting an optical signal to an electrical signal, comprising:
    a transimpedance amplifier;
    a photodetector connected between an input of the transimpedance amplifier and a high voltage supply providing a bias voltage to the photodetector;
    a high voltage supply variation sensing element connected between the high voltage supply and a current mirror, the current mirror having its output terminal connected to the input of the transimpedance amplifier; and
    a current limiter connected between a high voltage source and the high voltage supply.

2. The photoelectric receiver circuit of claim 1, wherein the photodetector comprises an avalanche photodiode.

3. The photoelectric receiver circuit of claim 1, further comprising a resistance connected between the high voltage source and the high voltage supply.

4. The photoelectric receiver circuit of claim 3, wherein the current limiter further comprises a diode, wherein the diode is one of the group comprising a PIN diode and a Schottky diode.

5. The photoelectric receiver circuit of claim 4, wherein:
    the diode is forward biased in normal operation; and
    the diode is maintained at a fixed voltage.

6. The photoelectric receiver circuit of claim 1, further comprising a feedback path between an output of the transimpedance amplifier and the high voltage supply.

7. A photoelectric receiver circuit for converting an optical signal to an electrical signal, comprising:
    a transimpedance amplifier;
    a photodetector connected between an input of the transimpedance amplifier and a high voltage supply providing a bias voltage to the photodetector;
    a high voltage supply variation sensing element connected between the high voltage supply and a current controlled current source (CCCS); and
    a current limiter connected between a high voltage source and the high voltage supply,
    wherein the CCCS is connected to the input of the transimpedance amplifier.

8. The photoelectric receiver circuit of claim 7, wherein the photodetector comprises an avalanche photodiode.

9. The photoelectric receiver circuit of claim 7, wherein the CCCS senses, fully rectifies and mirrors the current from the high voltage supply variation sensing element.

10. The photoelectric receiver circuit of claim 7, wherein the CCCS is configured to sense and mirror the current from the high voltage supply sensing element when the high voltage supply voltage increases.

11. The photoelectric receiver circuit of claim 7, wherein the high voltage sensing element has an impedance substantially equal to the impedance of the photodetector.

12. The photoelectric receiver circuit of claim 7, wherein the current limiter further comprises a diode, wherein the diode is one of the group comprising a PIN diode and a Schottky diode.

13. The photoelectric receiver circuit of claim 7, wherein:
    the diode is forward biased in normal operation; and
    the diode is maintained at a fixed voltage.

14. A photoelectric receiver circuit for converting an optical signal to an electrical signal, comprising:
    a differential transimpedance amplifier;
    a photodetector connected between a first input of the differential transimpedance amplifier and a high voltage supply providing a bias voltage to the photodetector;
    a first high voltage supply variation sensing element connected between the high voltage supply and a second input of the differential transimpedance amplifier;
    a second high voltage supply variation sensing element connected between the high voltage supply and a first current controlled current source (CCCS);
    a current limiter connected between a high voltage source and the high voltage supply;
    the first current controlled current source is connected between the second high voltage supply variation sensing element and the first input of the differential transimpedance amplifier; and
    a second CCCS connected between the second high voltage supply variation sensing element and the second input of the differential transimpedance amplifier.

15. The photoelectric receiver circuit of claim 14, wherein the current limiter is a resistor.

16. The photoelectric receiver circuit of claim 14, wherein the photodetector comprises an avalanche photodiode.

17. The photoelectric receiver circuit of claim 15, wherein the first high voltage sensing element and the second high voltage sensing element each have an impedance substantially equal to the impedance of the avalanche photodiode.

18. The photoelectric receiver circuit of claim 15, wherein the first CCCS is configured to sense, mirror and rectify a first input current to the differential transimpedance amplifier.

19. The photoelectric receiver circuit of claim 18, wherein the first CCCS is configured to sense and mirror the first input current only when the high voltage supply voltage increases.

20. The photoelectric receiver circuit of claim 18, wherein the second CCCS is configured to sense, mirror and rectifies a second input current to the differential transimpedance amplifier.

21. The photoelectric receiver circuit of claim 20, wherein the second CCCS is configured to sense and mirror the second input current only when the high voltage supply voltage increases.

22. The photoelectric receiver circuit of claim 15, wherein the current limiter further comprises a PIN diode.

23. The photoelectric receiver circuit of claim 15, wherein the current limiter further comprises a Schottky diode.

24. The photoelectric receiver circuit of claim 1, wherein the photodetector further comprises an anode connected to the input of the transimpedance amplifier and a cathode connected to the high voltage supply.

25. The photoelectric receiver circuit of claim 7, wherein the photodetector further comprises an anode connected to the input of the transimpedance amplifier and a cathode connected to the high voltage supply.

26. The photoelectric receiver circuit of claim 14, wherein the photodetector further comprises an anode connected to the first input of the differential transimpedance amplifier and a cathode connected to the high voltage supply.

\* \* \* \* \*